United States Patent
Ubachs et al.

(10) Patent No.: US 11,211,544 B2
(45) Date of Patent: Dec. 28, 2021

(54) ACTUATOR OR SENSOR DEVICE BASED ON AN ELECTROACTIVE OR PHOTOACTIVE POLYMER

(71) Applicant: KONINKLIJKE PHILIPS N.V., Eindhoven (NL)

(72) Inventors: Rene Leonardus Jacobus Marie Ubachs, Eindhoven (NL); Valentina Lavezzo, Eindhoven (NL); Cornelis Petrus Hendriks, Eindhoven (NL); Eduard Gerard Marie Pelssers, Eindhoven (NL); Daan Anton Van Den Ende, Eindhoven (NL); Mark Thomas Johnson, Eindhoven (NL); Roland Alexander Van De Molengraaf, Eindhoven (NL); Peter Coops, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 805 days.

(21) Appl. No.: 15/752,748

(22) PCT Filed: Aug. 19, 2016

(86) PCT No.: PCT/EP2016/069679
§ 371 (c)(1),
(2) Date: Feb. 14, 2018

(87) PCT Pub. No.: WO2017/036815
PCT Pub. Date: Mar. 9, 2017

(65) Prior Publication Data
US 2018/0254404 A1    Sep. 6, 2018

(30) Foreign Application Priority Data

Aug. 31, 2015 (EP) .................................... 15183165

(51) Int. Cl.
*H01L 41/09* (2006.01)
*H01L 41/193* (2006.01)
(Continued)

(52) U.S. Cl.
CPC ................ *H01L 41/09* (2013.01); *B32B 7/04* (2013.01); *F03G 7/00* (2013.01); *F03G 7/005* (2013.01);
(Continued)

(58) Field of Classification Search
CPC ... H01L 41/09; H01L 41/0933; H01L 41/193; B32B 7/04; F03G 7/00; F03G 7/005
(Continued)

(56) References Cited

U.S. PATENT DOCUMENTS 6,781,285 B1    8/2004 Lazarus et al.
7,161,279 B2 *  1/2007 Topliss ................. H01L 41/092
                                                    310/330

(Continued)

FOREIGN PATENT DOCUMENTS

EP    2133306 A1    12/2009
JP    03171784 A     7/1991
(Continued)

*Primary Examiner* — Bryan P Gordon
(74) *Attorney, Agent, or Firm* — Schott, P.C.

(57) ABSTRACT

An actuator or sensor device comprises an electroactive polymer (EAP) arrangement which extends between fixed opposite ends. The electroactive polymer arrangement comprises a passive carrier layer and an active electroactive polymer layer, wherein at or adjacent the ends, the passive carrier layer and the active EAP layer are mounted with one over the other in a first order, and at a middle area between the ends, the carrier layer and the active EAP layer are mounted in an opposite order. This enables internal stresses (Continued)

and moments within the electroactive polymer arrangement to be used more effectively to contribute to displacement or actuation force.

17 Claims, 5 Drawing Sheets

(51) Int. Cl.
  *F03G 7/00* (2006.01)
  *B32B 7/04* (2019.01)
(52) U.S. Cl.
  CPC ........ *H01L 41/0933* (2013.01); *H01L 41/193* (2013.01)
(58) Field of Classification Search
  USPC ....... 310/324, 328, 331, 332, 353, 354, 365, 310/800
  See application file for complete search history.

(56) References Cited

U.S. PATENT DOCUMENTS

| | | | |
|---|---|---|---|
| 7,575,807 B1 | 8/2009 | Barvosa-Carter et al. | |
| 7,948,151 B1 | 5/2011 | Blackburn et al. | |
| 2006/0238066 A1* | 10/2006 | Pelrine | F04B 43/043 310/309 |
| 2007/0120444 A1* | 5/2007 | Kato | F03G 7/06 310/330 |
| 2007/0184238 A1 | 8/2007 | Hockaday et al. | |
| 2009/0026892 A1 | 1/2009 | Nakamura et al. | |
| 2009/0242813 A1 | 10/2009 | Hirata et al. | |
| 2010/0007245 A1 | 1/2010 | Jager et al. | |
| 2012/0032559 A1 | 2/2012 | Hino et al. | |
| 2018/0138833 A1* | 5/2018 | van den Ende | H01L 41/053 |
| 2019/0198749 A1* | 6/2019 | Behera | H01L 41/193 |
| 2019/0331627 A1* | 10/2019 | Linde | G01M 5/0033 |

FOREIGN PATENT DOCUMENTS

| | | |
|---|---|---|
| JP | 2011054615 A | 3/2011 |
| WO | 2005072809 A1 | 8/2005 |
| WO | 2007090621 A2 | 8/2007 |
| WO | 2007126520 A2 | 11/2007 |
| WO | 2010054115 A1 | 5/2010 |
| WO | 2012032443 A1 | 3/2012 |
| WO | 2012035491 A1 | 3/2012 |

* cited by examiner

ACTUATOR OR SENSOR DEVICE BASED ON AN ELECTROACTIVE OR PHOTOACTIVE POLYMER

CROSS-REFERENCE TO PRIOR APPLICATIONS

This application is the U.S. National Phase application under 35 U.S.C. § 371 of International Application No. PCT/EP2016/069679, filed on Aug. 19, 2016, which claims the benefit of EP Patent Application No. EP 15183165.8, filed on Aug. 31, 2015. These applications are hereby incorporated by reference herein.

FIELD OF THE INVENTION

This invention relates to actuator and/or sensor devices which make use of electroactive or photoactive polymers.

BACKGROUND OF THE INVENTION

Electroactive polymers (EAPs) and photoactive polymers can be used to apply a force to a load based on an electrical or light stimulus.

Electroactive polymers (EAP) are in particular an emerging class of materials within the field of electrically responsive materials. EAP's can also work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

Devices using electroactive polymers can be subdivided into field-driven and ionic-driven materials.

Examples of field-driven EAPs are dielectric elastomers, electrostrictive polymers (such as PVDF based relaxor polymers or polyurethanes) and liquid crystal elastomers (LCE).

Examples of ionic-driven EAPs are conjugated polymers, carbon nanotube (CNT) polymer composites and Ionic Polymer Metal Composites (IPMC).

Field-driven EAP's are actuated by an electric field through direct electromechanical coupling, while the actuation mechanism for ionic EAP's involves the diffusion of ions. Both classes have multiple family members, each having their own advantages and disadvantages.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

The expansion and consequent movement or change in shape of the EAP device is in many cases used to deliver an actuation force to an external component.

There are various known ways to mount a bending EAP actuator or sensor to induce a symmetric deflection. Some examples are shown in FIG. 3. The EAP layer 30 is provided on a passive backing layer 32, and the EAP layer is shown in its activated (expanded) state.

FIG. 3(a) shows ends which are free to slide in a plane. The curvature induced by expansion of the active EAP layer causes it to bow upwardly.

FIG. 3(b) shows a simply supported design, with a hinge arrangement at each end.

FIG. 3(c) shows a clamped arrangement, with fixed clamps at each end.

All of these methods have their own disadvantages and limit either the force or the displacement or both.

Free edges give rise to a large actuator center displacement but the actuator force is limited and the small horizontal movements of the actuator edges lead to mechanical wear.

A simply supported actuator is ideal from a theoretical point of view because it allows a large actuator center displacement combined with a large force. A practical implementation of hinges with a small form factor is difficult because of the space needed for the mechanical parts (e.g. bearings), and the mechanical complexity and reliability (extra moving mechanical components). This also has unpredictable and/or uncontrollable friction, wear and play.

Mechanical fixating, for example by clamping or gluing, is simple and allows a large force to be delivered. However, the major shortcoming is the suppressed vertical displacement capability near the fixation point. This significantly reduces the actuator center displacement.

The disadvantages of these known fixation methods lead to trade-offs between force, displacement and mechanical complexity.

There is therefore a need for a design that does not have the disadvantages of having fixed ends (i.e. the small deflection) while maintaining the benefit of a large load bearing capacity.

SUMMARY OF THE INVENTION

It is an object of the invention to fulfill the aforementioned need. With the invention as defined by the independent claims, this object is at least partly reached. The dependent claims provide advantageous embodiments.

According to the invention there is provided an actuator and/or sensor device that includes an active layer that can be actuated upon providing it with an actuation stimulus and a passive carrier layer to which the active layer is attached either directly or indirectly (other layers or force transformation layers) where the order of these layers is opposite at different regions/parts of the actuation arrangement.

By providing different regions with different stacking order of the passive carrier layer and the active layer, the internal forces within the active arrangement are able to be used more effectively to deliver displacement or force. Thus, with reference to FIG. 4, the problem with prior art devices not having the order reversal is caused by the moment 40 generated close to the clamped ends. This moment works against the actuator center displacement. As a result, the center displacement 42 is restricted. By reversing the top-bottom location of the passive carrier layer near the fixed ends as defined by the invention, the bending moment works in the direction of and thus adds to the desired actuator center displacement.

The term "actuation arrangement" is used to indicate generally an arrangement that can provide a deformation upon its stimulation with an actuation signal where the deformation is caused by stimulation of a part of or all of the photoactive and/or electroactive polymer present in the actuation arrangement. Thus, a device of the invention can comprise an electroactive polymer requiring an electrical signal (voltage and/or current) for its actuation signal, can have a photoactive polymer requiring a radiation signal (e.g. optical signal UV such as UV-vis, visible radiation, IR, or Near IR) for its actuation signal or can have both. There can even be materials having both properties in one material available.

The active layer and passive carrier layer are arranged to be in mechanical communication, i.e. actuation of the actuation layer is influenced by the passive presence of the carrier layer (see for example FIG. 2, where its presence causes curving of the actuation arrangement). They are preferably partly or entirely mechanically attached to each other through at least one interface between them. They can alternatively be connected or attached so to speak through electrical or magnetic forces. There may be one or more layers affixed between them.

The active layer can have a matrix material comprising therein the electroactive material and/or photoactive material. The active layer can also have one or more continuous layers of preferably one, but can be more, electroactive polymer or photoactive polymer. The active layer can have a stack of different layers of electroactive polymer or photoactive polymer.

Having one layer order reversal (active layer vs passive carrier layer) in the actuation arrangement will improve its properties as described above, even if that arrangement is clamped between two fixed ends. To have even more improved functioning, there is one reversal of layer order per fixed end. Thus when the actuation arrangement is clamped between two ends, then there are preferably two layer order reversal points in the actuation arrangement. There are preferably exactly three regions between the fixed opposite ends, corresponding to two regions where the curvature is of one type (i.e. convex or concave) and one region where curvature is of opposite type.

The device may be adapted to bend upwardly in the middle with respect to a base of the device, wherein the carrier layer is over the active layer at or adjacent the ends and the active layer is over the carrier layer at the middle area. It should be understood that "upwardly" is used to mean away from the base of the device. The device may be mounted in any orientation with respect to the direction of gravity.

This means that after deformation, the active layer is always on the longer side, because the actuation arrangement deforms with three bend sections (similar to a negative cosine function shape from 0 to 360 degrees). The actuation arrangement is divided into three zones to match the changing direction of curvature between concave and convex.

The actuation arrangement may be connected to the fixed opposite ends by the active layer and the passive carrier layer. This provides a secure mechanical fixing to the ends. Instead, the actuation arrangement may be connected to the fixed opposite ends only by the active polymer layer. This enables greater deflection at the ends.

Different designs may be used to set a different compromise between the displacement distance and the actuation force available.

The passive carrier layer may comprise end portions and a middle portion, with the middle portion mounted over an opposite side of a continuous active layer to the end portions. This version divides the carrier layer into different portions, on opposite sides of a single active layer.

Alternatively, the active layer may comprise end portions and a middle portion, with the middle portion mounted over an opposite side of a continuous passive carrier layer to the end portions. This version divides the active layer into different portions, on opposite sides of a single carrier layer. The carrier layer is typically stronger and thus may provide a better continuous support for the actuation arrangement.

In one example, in a non-actuated state, the actuation arrangement may be formed with a pre-bend. This may be achieved by suitable spacing of the ends compared to the length of the actuation arrangement at rest.

In another example, in a non-actuated state, the actuation arrangement is flat, and the device comprises a pre-shaping feature to make the actuation arrangement bend in a desired direction upon actuation. This enables a more compact design.

The device or actuation arrangement, or active layer may comprise one or more (plurality) of electrodes to provide actuation signals to one or more portions of the actuation layer and thus electroactive polymer.

The device can have an optical arrangement for providing radiation signals (e.g UV, UV-vis, visible, IR or near IR radiation) for actuation to the actuation arrangement or active layer. Such optical arrangement can comprise one or more of a number of elements to manipulate actuation radiation. Such elements include: lenses, mirrors, guide wires or other radiation guides, prisms, splitters, filters, switches, polarizers. The optical arrangement can have a part or be entirely part of the actuation arrangement (for example when it is in the form of a light guide attached to the active layer).

The electrodes or optical arrangement can be configured to allow different portions of the actuation arrangement or active layer to be driven/actuated independently. Segmentation of actuation in this way may improve the mechanical moment working in the direction of the actuator center displacement.

The passive carrier layer may comprise a set of surface channels. This defines an asymmetric substrate which can be used to make displacement easier.

The active layer may for example be planar in a non-actuated state.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an actuator and/or sensor device comprising an actuator arrangement having an active layer (including an electroactive and/or photoactive polymer) and a passive carrier layer where the actuator arrangement which extends between fixed opposite ends. The polymer arrangement comprises a passive carrier layer and an active polymer layer, wherein at or adjacent the ends, the carrier layer and the active polymer layer are mounted with one over the other in a first order, and at a middle area between the ends, the carrier layer and the active layer are mounted in an opposite order.

This enables internal stresses and moments within the electroactive polymer arrangement to be used more effectively to contribute to the displacement or actuation force.

The invention will now be described with reference to various actuator designs using one or more electroactive polymer layers. The same structural features may however also be used as a sensor. Thus, the examples below are explained in the context of an actuator, but more generally these are EAP devices which may be actuator units or sensor units. Furthermore, the purpose of the active EAP layer is to expand or contract in response to an electrical actuation signal. The same function may be implemented by a photoactive polymer layer which will instead respond to an optical stimulus. Polymers that can be used as electroactive and/or photoactive polymers will be described hereinbelow.

Figure 5:
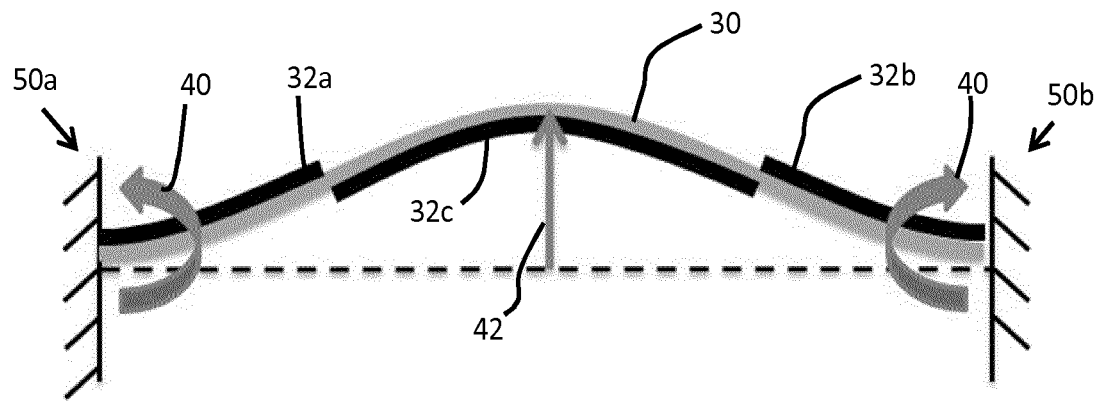
FIG. 5 shows a first example of EAP actuator device in schematic form.

FIG. 5 shows a first example of EAP actuator device.

This example has an active layer 30 in the form of an electroactive polymer (EAP). The layer 30 extends between facing end clamps 50a, 50b. The EAP layer bends when expanded as a result of the interaction with a passive carrier layer 32. The carrier layer constrains the bending to be in the desired direction. The carrier layer and the active EAP layer may together be considered to be an "actuation arrangement or even an EAP arrangement".

The carrier layer comprises three portions. First and second portions 32a, 32b are at each end of the EAP layer, at the connections to the clamps 50a, 50b. These portions are over the top of the EAP layer 30 so that when the EAP layer expands, upward bending takes place at these portions 32a, 32b (convex when viewed from above and concave when viewed from below). A third, central portion 32c is over a middle section of the EAP layer and underneath. When the EAP layer expands, downward bending takes place at this portion (concave when viewed from above and convex when viewed from below). Thus, the overall shape will be concave and convex at different regions, and pre-shaping is used to control the direction of bending.

Figure 4:
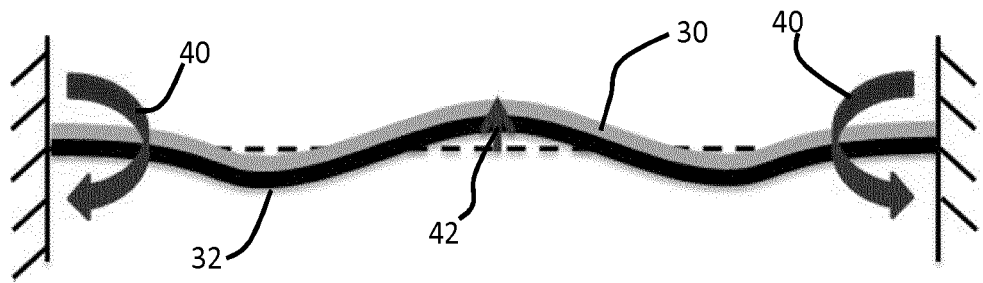
FIG. 4 is used to explain a problem of fixed support between two ends.

In this way, the position of the carrier layer near the clamps is reversed, such that the moment 40 near the clamps works with the actuator center displacement 42 instead of against the actuator center displacement. As a result, the center displacement 42 of the actuator is increased compared to an actuator with a single-sided passive carrier layer as shown in FIG. 4.

The optimum geometry and improvement factor may be determined by modeling and/or testing. The EAP layer and carrier layer deform such that the carrier layer is always on the shorter curve side, as the EAP expands when activated.

Finite element simulations have been performed to assess the feasibility of various designs. The active layer is modeled as a Neo-Hookean solid with the electromechanical force described by the Maxwell stress. The default dimensions and properties used are:

| | | |
|---|---|---|
| Active layer thickness | 0.2 | mm |
| Active layer C10 (stress-strain constant) | 48 | MPa |
| Active layer apparent permittivity | 2E−6 | F/mm |
| Carrier thickness | 0.1 | mm |
| Carrier Young's modulus | 1375 | MPa |
| Carrier Poisson's ratio | 0.4 | |
| Actuator length (between clamps) | 12 | mm |
| Actuator width | 12.5 | mm |
| Applied voltage | 250 | V |
| Outer carrier portion length (2 of) | 2.5 | mm |
| Middle carrier portion length | 8 | mm |

Figure 1:
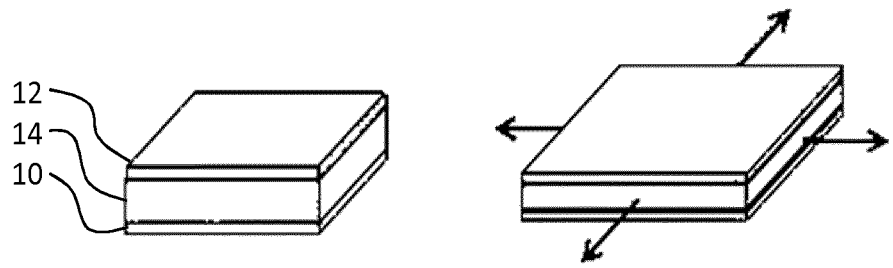
FIG. 1 shows a known electroactive polymer device which is not clamped.
Figure 2:
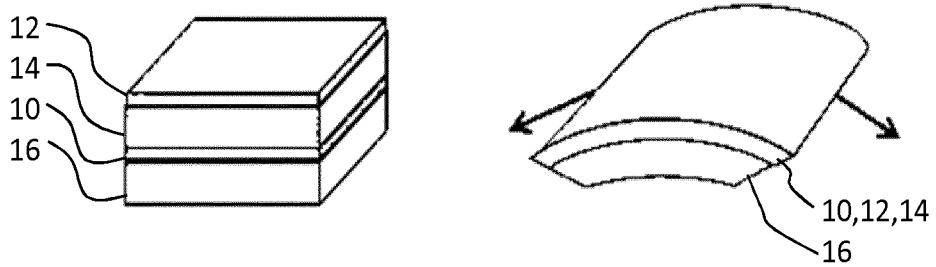
FIG. 2 shows a known electroactive polymer device which is constrained by a backing layer.
Figure 3:
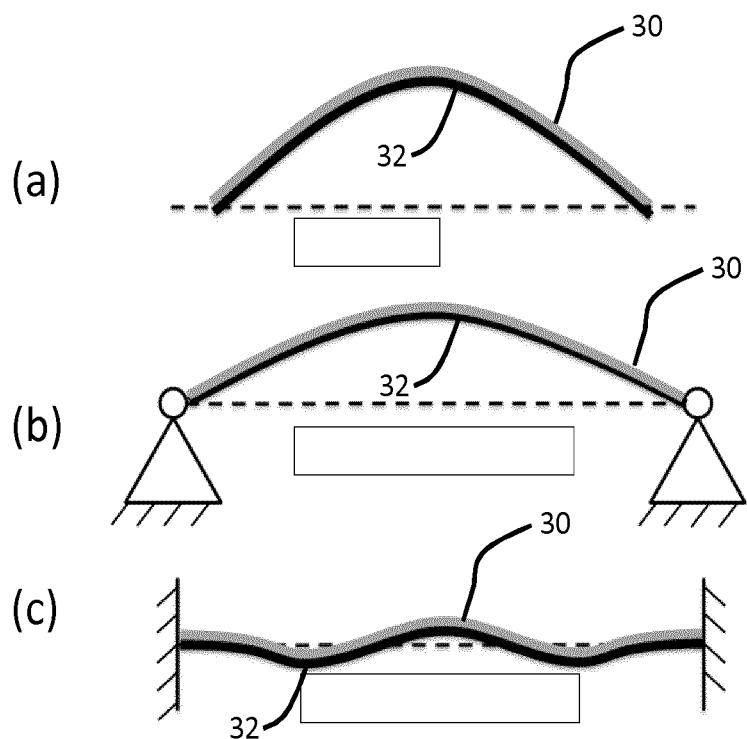
FIG. 3 shows three different ways of supporting a bending EAP actuator.

To set a baseline, a simulation was first performed of a conventional fixed actuator as shown in FIG. 3. The maximum deflection obtained was 0.284 mm and maximum force 0.25 N.

Figure 6:
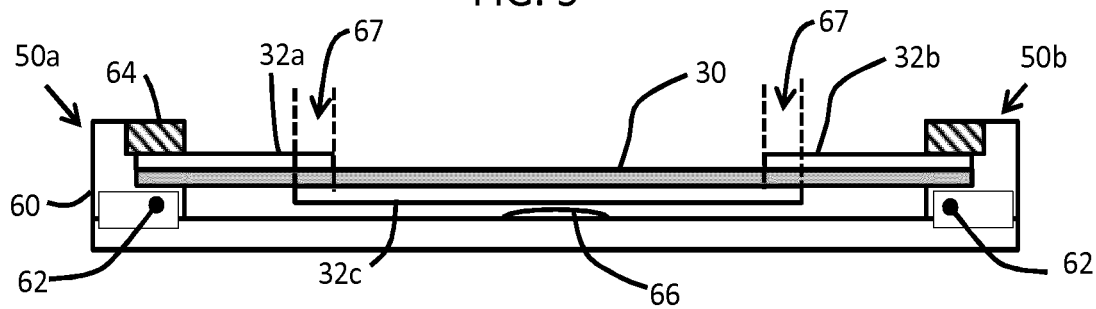
FIG. 6 shows an implementation of the device of FIG. 5.

FIG. 6 shows an implementation of the structure of FIG. 5. The EAP layer 30 and the three-piece carrier layer 32a, 32b, 32c are mounted in a frame 60. The ends rest on ledges 62, and they are clamped in place by a ring or glue 64. In the center of the frame, a small pre-shaping ridge 66 is introduced to guide the actuator deflection in the desired direction. The carrier layer portions overlap each other on each side at locations 67. This does not have significant influence on the displacement but it avoids problems of stress concentrations and high shear loads at these points.

The simulation performed showed that the deflection in the actuated state is 0.69 mm, and the maximum force is 0.8 N. Both the force and deflection are higher than in the baseline case.

Instead of using a pre-shaping ridge, the pre-shaping may be accomplished by moving the clamps 50a, 50b towards each other, forcing the actuator to have an initial curvature. This can significantly increase the amount of force the actuator can withstand in its actuated state. The finite element analysis for such a version shows an effective deflection of 0.33 mm, less than half than obtained with the example of FIG. 6, but the maximum possible load is 2.92 N in this case, several factors higher than obtained with the example of FIG. 6.

Figure 7:
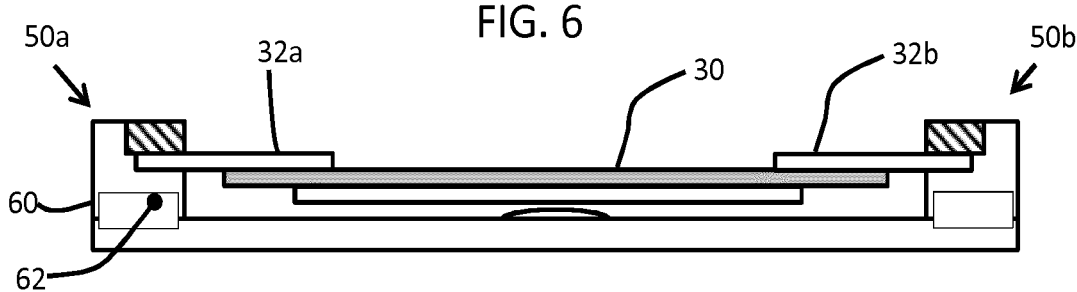
FIG. 7 shows a second example of EAP actuator device.

FIG. 7 shows another example. It differs from FIG. 6 only that the EAP layer 30 terminates just before the clamps 50a, 50b so that only the first and second carrier layer portions 32a, 32b are clamped.

Thus, the edge carrier layer portions 32a, 32b extend beyond the active EAP layer 30 and the device is fixated using these extensions.

Figure 8:
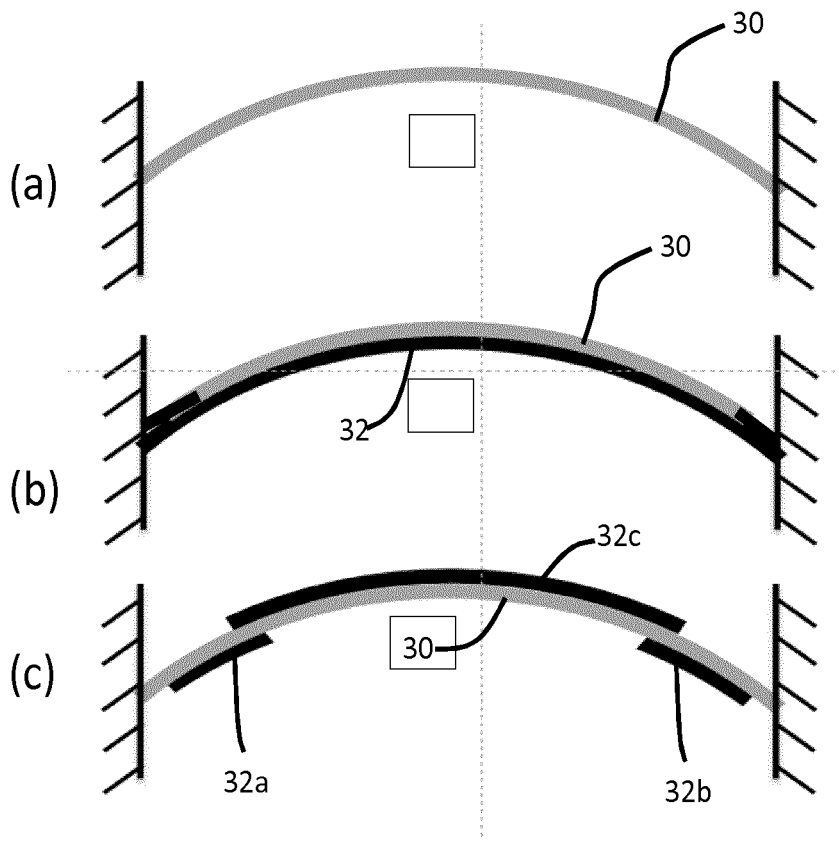
FIG. 8 shows three design options which have been simulated for the purposes of comparison.

FIG. 8 shows three possible connection schemes for the purposes of comparison. FIG. 8(a) shows an active EAP layer only extending between clamps. FIG. 8(b) shows a stacked active EAP layer and passive carrier layer, with both layers clamped. FIG. 8(c) shows an actuator with the segmented carrier layer as explained above, and with the EAP layer 30 only clamped at each end.

Figure 9:
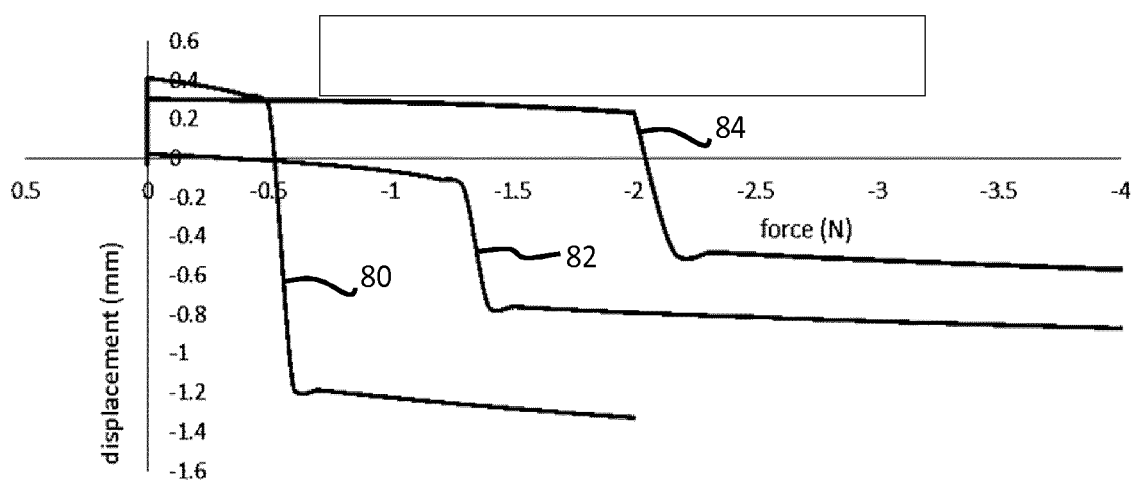
FIG. 9 presents the simulation results for the three design options of FIG. 8.

Each actuator is initially pre-shaped by an equal amount to assure deflection in the desired direction. A voltage is applied causing the actuator to deflect, after which a force, applied to the center of the actuator, is gradually increased until the actuator is pushed back to zero or less deflection. The force-deflection curves are shown in FIG. 9.

The version of FIG. 8(a) with an active EAP layer only exhibits the largest deflection, but is limited in force as shown in plot 80. The stacked actuator of FIG. 8(b) has a reduced deflection as shown by plot 82. The actuator of FIG. 8(c) also delivers approximately 30% less deflection than the active layer version, but can withstand 400% more force. This is shown as plot 84.

Figure 10:
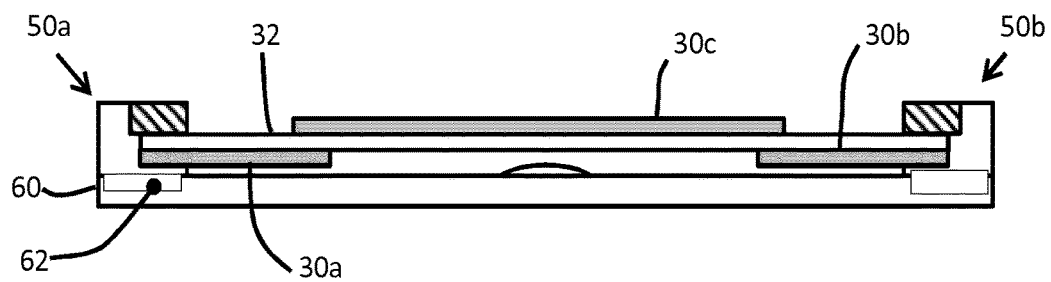
FIG. 10 shows a third example of EAP actuator device.

The example above has a split carrier layer. An alternative is shown in FIG. 10, in which the EAP layer is divided into three parts instead of the carrier layer. Thus, the EAP layer has first, second and third portions 30a, 30b, 30c. The first and second portions are underneath the carrier layer 32, and are at the ends so that they connect to the clamps. The middle, third portion of the EAP layer 30c is on top of the carrier layer 32.

The carrier layer 32, which may for example be stronger than the EAP layer, is then continuous, so that a stronger actuator is made possible, in particular less sensitive to stress concentrations than the EAP layer.

Finite element simulations of one version of this embodiment shows a deflection of 0.324 mm and a force of approximately 1.2 N. Compared to the baseline this amounts to a relatively small improvement in the deflection, but a significantly higher force can be delivered.

Figure 11:
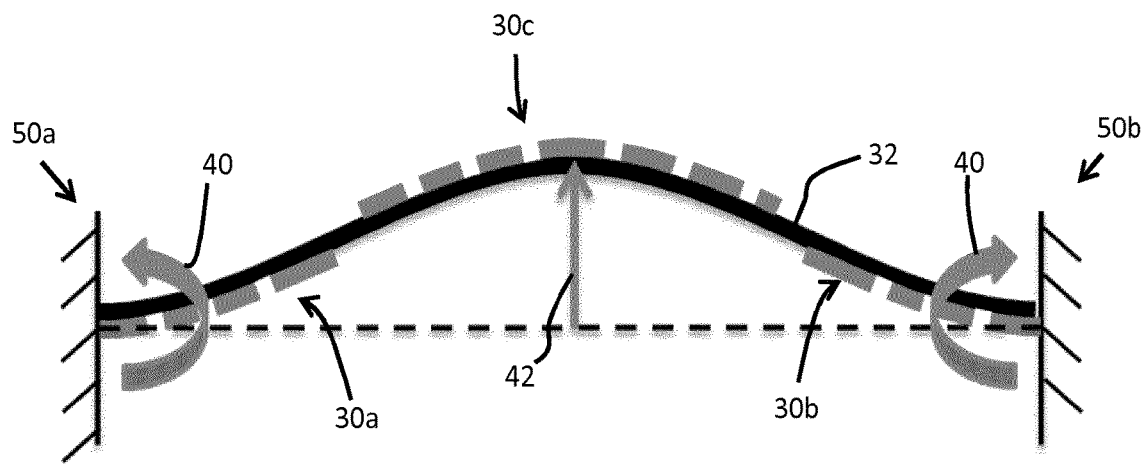
FIG. 11 shows a fourth example of EAP actuator device.

FIG. 11 shows a further example, which uses a segmented EAP layer 30. There are first, second and third portions 30a, 30b, 30c as in the example of FIG. 10. Furthermore, the middle portion and/or the edge portions are further segmented. The example shows all three portions as further segmented. The segments of the EAP layer portions may in some examples be activated separately in order to control the bending process.

The EAP segments of the portions 30a, 30b close to the clamps are first activated and subsequently the EAP segments in the middle part of the actuator are activated. This may improve the control of the bending applied. However, this improved control is at the expense of lower forces and smaller stroke of the actuator.

This method of actuation thus makes use of a sequential activation of the electrodes. The sides (30a and 30b) may be actuated first, in order to pre-bend the actuator upwards so that when actuating the middle part (30c) the further bending will take place in the upward direction.

Figure 12:
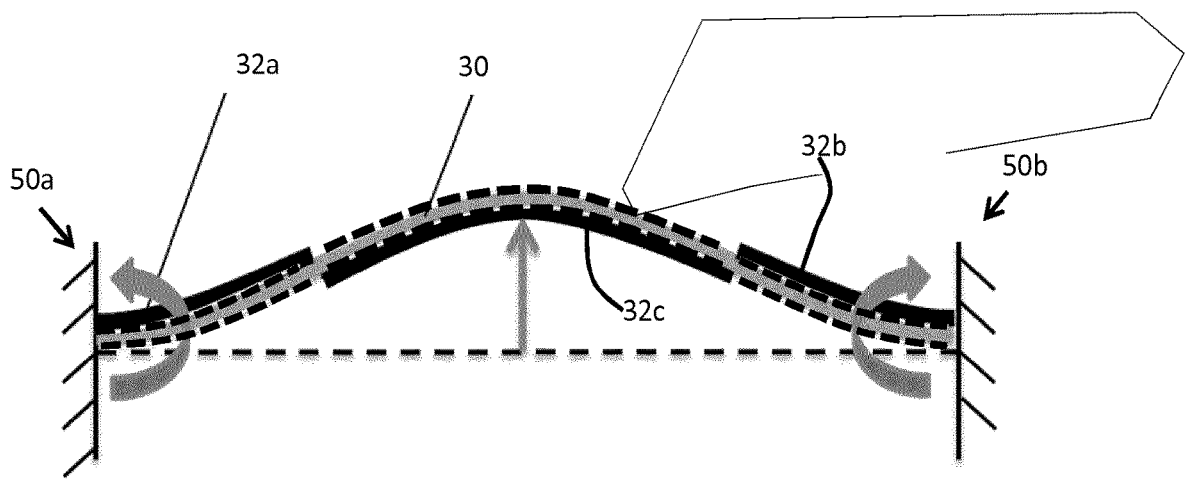
FIG. 12 shows a fifth example of EAP actuator device.

FIG. 12 shows a further example which combines a segmented carrier 30a, 30b, 30c with segmented electrodes on the continuous EAP layer 30.

The EAP layer 30 can then be actuated locally by addressing the segmented electrodes separately. For example, the EAP layer may first be locally activated at the edges and subsequently the middle part of the EAP is activated.

Figure 13:
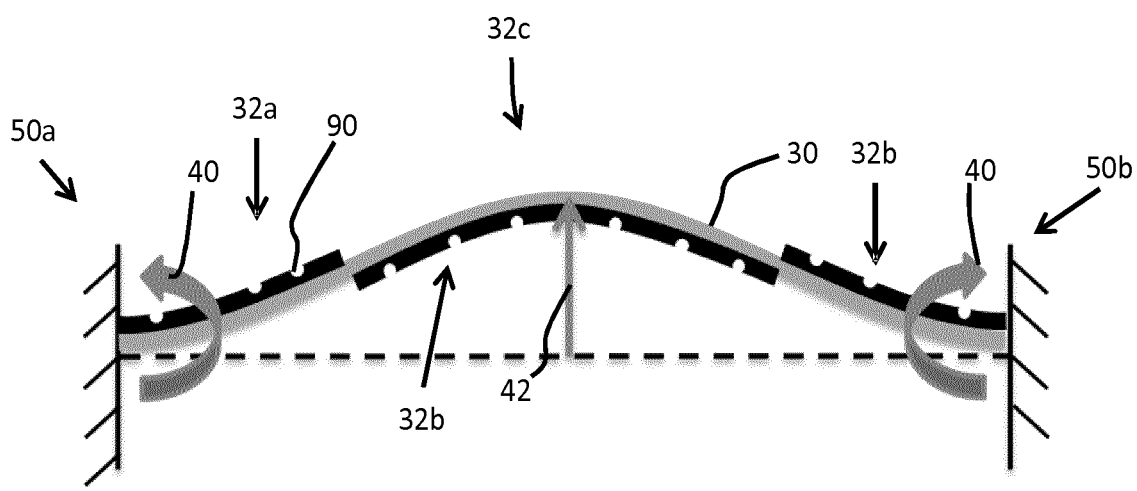
FIG. 13 shows a sixth example of EAP actuator device.

FIG. 13 shows an implementation having the carrier layer 32 formed into portions 32a, 32b, 32c, and it further has an array of channels 90 formed in the outer surface of the carrier layer to make the actuator displacement easier. These may be only in the edge portions where the bending radius may be smaller, or they may be in all three sections as shown. Bending of the carrier layer tends to close the channels, and they therefore reduce compressive stresses in the carrier layer at least while the channels remain open. When the channels become closed a locking function may then be implemented at a specific actuator deflection. In this way, the carrier layer is easier to bend while the channels remain open. This approach may be applied to any of the examples above.

As mentioned above, the same structure may be used as a sensor. Externally induced compression generates a change in electric field which results in measurable signals on the electrodes.

In the case of a sensor, there is a benefit of a stiffer and more sensitive structure than for example a fully clamped bimorph sensor with backing only on one side, because in that continuous configuration, part of the stresses will counteract the sensor signal.

The overall EAP arrangement may for example have dimensions of 10 mm×10 mm×0.5 mm. A typical and non-limiting size range may be from 50 mm×50 mm×2 mm to 2 mm×2 mm×0.1 mm. The shape in plan view may be square, but it may instead be an elongate rectangle or circular. In the case of a circular shape, the segmented carrier layer elements take the form of concentric circles.

The devices described above have the active layer sandwiched between electrodes to provide them with suitable electrical actuation signals such as voltage or current signals. The electrodes for reasons of clarity have not been shown. The carrier layer can be between the electrodes also (in case of a field driven active layer), but alternatively may not be if current driven active layer is needed or used.

Materials suitable for the EAP layer are known. Electroactive polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Additional passive layers may be provided for influencing the behavior of the EAP layer in response to an applied electric field.

The EAP layer of each unit may be sandwiched between electrodes. In case the invention uses a dielectric elastomer as the active material, then this layer or material is sandwiched between these electrodes such that a voltage signal on the electrodes can make the material become squeezed by the electrodes. Such attachment can also be used in other cases, but is not always needed, such as with piezo or ferroelectric (relaxor or not) materials. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylene-dioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The EAP devices may be electric field driven devices or ionic devices. Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

As mentioned above, the mechanical designs explained above may also be applied to photoactive materials. Such photo-mechanically responsive materials for example consist of photo-mechanically responsive molecules embedded in a polymer matrix. The photo-mechanically responsive molecules change shape as a function of an applied illumination with light of a certain wavelength.

The most common photo-mechanical materials are driven by a shape change between two isomeric states in the photoresponsive molecules present in the material. The switch between the trans configuration is driven by illuminating with light corresponding to the absorption wavelength of the molecule in the trans state while the switch back to the metastable cis form can be thermally induced or once again triggered by illuminating with light of a wavelength which corresponds to the absorption wavelength of the molecule in its cis state.

Such materials include but not limited to anthracenes, diarylethenes, spiropyrans and azobenzenes, including substituted azobenzenes such as aminoazobenzenes and pseudostilbenes. These photo-mechanically responsive molecules are embedded in a polymer material, either via doping of host polymers with such functional photo-mechanically responsive molecules or via covalently bonded molecules with photo-mechanical functionality in the polymer via polymerization. This includes polymerization of azofunctionalized monomers or post-functionalization of polymers with a different backbone, creating side-chain azofunctionalized polymers.

Polymers can be amorphous or liquid crystalline (LC) in nature. Where amorphous polymers contract equally in all directions, LC polymers can be made to deform in a preferential direction, greatly increasing the effect in that direction. Liquid crystal elastomers (LCE's) are especially suitable materials for photo mechanical materials, since they can have LC induced directionality in an all solid state polymer material.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a

The invention claimed is:

1. A device comprising:
an actuation arrangement,
wherein the actuation arrangement extends between fixed opposite ends,
wherein the actuation arrangement comprises a layer stack, the layer stack comprising:
an active layer comprising an electroactive polymer, and
a passive carrier layer,
wherein at, or adjacent to, at least one of the fixed opposite ends, the passive carrier layer and the active layer are mounted with one over the other in a first order, and at a middle area between the fixed opposite ends, the passive carrier layer and the active layer are mounted with one over the other in a second order, and
wherein the second order is opposite to the first order.

2. The device as claimed in claim 1, further comprising a base,
wherein the actuation arrangement is arranged to bend upwardly in the middle area with respect to the base, and
wherein the first order arranges the passive carrier layer over the active layer.

3. The device as claimed in claim 1, wherein the actuation arrangement is connected to the fixed opposite ends by the active layer and the passive carrier layer.

4. The device as claimed in claim 1, wherein the actuation arrangement is connected to at least one of the fixed opposite ends only by the active layer.

5. The device as claimed in claim 1,
wherein the passive carrier layer comprises end portions and a middle portion, and
wherein the middle portion is mounted over an opposite side of a continuous active layer to the end portions.

6. The device as claimed in claim 1,
wherein the active layer comprises end portions and a middle portion, and
wherein the middle portion is mounted over an opposite side of a continuous passive carrier layer to the end portions.

7. The device as claimed in claim 1, wherein in a non-actuated state, the actuation arrangement is formed with a pre-bend.

8. The device as claimed in claim 1,
wherein in a non-actuated state, the actuation arrangement is flat, and
wherein the device further comprises a pre-shaping feature to make the actuation arrangement bend in a desired direction upon actuation.

9. The device as claimed in claim 1,
wherein the active layer comprises one or more electrodes, and
wherein the one more electrodes are arranged for actuating the actuation arrangement.

10. The device as claimed in claim 9, wherein the one or more electrodes are part of the actuation arrangement.

11. The device as claimed in claim 1 further comprising an optical arrangement,
wherein the active layer further comprises the photoactive polymer, and
wherein the optical arrangement provides actuation radiation to the photoactive polymer.

12. The device as claimed in claim 11,
wherein the optical arrangement comprises an element,
wherein the element comprises one or more of: a lens, a mirror, a prism, an optical wire or other light guide, a polarization element, a radiation filter, and a radiation splitter, and
wherein the element(s) are arranged to manipulate the actuation radiation.

13. The device as claimed in claim 9 wherein the one or more electrodes are distributed such that different portions of the actuation arrangement can be actuated independently.

14. The device as claimed hi claim 1, wherein the passive carrier layer comprises a set surface channels.

15. A device comprising:
an actuation arrangement,
wherein the actuation arrangement extends between fixed opposite ends,
wherein the actuation arrangement comprises a layer stack, the layer stack comprising:
an active layer comprising a photoactive polymer, and
a passive carrier layer,
wherein at, or adjacent to, at least one of the fixed opposite ends, the passive carrier layer and the active layer are mounted with one over the other in a first order, and at a middle area between the fixed opposite ends, the passive carrier layer and the active layer are mounted with one over the other in a second order, and
wherein the second order is opposite to the first order.

16. The device as claimed in claim 11, wherein the device is configured such that that different portions of the actuation arrangement can be actuated independently.

17. The device as claimed in claim 1, wherein the active layer is planar in a non-actuated state.

* * * * *